(12) United States Patent
Wu et al.

(10) Patent No.: US 9,281,015 B1
(45) Date of Patent: Mar. 8, 2016

(54) STORAGE MEDIA CONVERSION DEVICE AND SERVER USING THE SAME

(71) Applicant: AIC INC., Taoyuan Hsien (TW)

(72) Inventors: Wei-Shih Wu, Taoyuan Hsien (TW); Kun-Sheng Tsai, Taoyuan Hsien (TW)

(73) Assignee: AIC INC., Taoyuan Hsien (TW)

( * ) Notice: Subject to any disclaimer, the term of this patent is extended or adjusted under 35 U.S.C. 154(b) by 0 days.

(21) Appl. No.: 14/569,784

(22) Filed: Dec. 14, 2014

(51) Int. Cl.
| | |
|---|---|
| *H05K 5/00* | (2006.01) |
| *H05K 7/00* | (2006.01) |
| *G11B 33/02* | (2006.01) |
| *G11B 33/04* | (2006.01) |
| *H05K 5/02* | (2006.01) |
| *H05K 5/03* | (2006.01) |
| *H05K 7/14* | (2006.01) |

(52) U.S. Cl.
CPC .......... *G11B 33/022* (2013.01); *G11B 33/0483* (2013.01); *H05K 5/0004* (2013.01); *H05K 5/0217* (2013.01); *H05K 5/03* (2013.01); *H05K 7/1488* (2013.01)

(58) Field of Classification Search
CPC ..................................................... G06F 1/184
USPC .................................................... 361/679.29
See application file for complete search history.

(56) References Cited

U.S. PATENT DOCUMENTS

| | | | |
|---|---|---|---|
| 2006/0126288 A1* | 6/2006 | Chen ....................... | G06F 1/184 361/679.33 |
| 2009/0091884 A1* | 4/2009 | Walker ..................... | G06F 1/187 361/679.37 |
| 2012/0299453 A1 | 11/2012 | Dunham et al. | |

OTHER PUBLICATIONS

Office Action dated Jul. 8, 2015 of the corresponding Russian utility model application.

* cited by examiner

*Primary Examiner* — Jerry Wu
(74) *Attorney, Agent, or Firm* — Chun-Ming Shih; HDLS IPR Services

(57) ABSTRACT

A storage media conversion device includes a mounting bracket (100) and a holder (200). The mounting bracket (100) includes a first baseplate (110) and two corresponding side plates (120) extending perpendicularly from the first baseplate (110). The first baseplate (110) and the two side plates (120) enclose a first loading space (130). Any of the side plates (120) includes a first resilient positioning portion (150) for positioning a first size hard disk (A). A holder (200) includes a pivot shaft (210) pivotally connected to one side of the first baseplate (110), a handle (220) rotatable with respect to the pivot shaft (210), and a contact portion (230) disposed close to the pivot shaft (210). The length from the handle (220) to the pivot shaft (210) is greater than the length from the contact portion (230) to the pivot shaft (210).

19 Claims, 7 Drawing Sheets

STORAGE MEDIA CONVERSION DEVICE AND SERVER USING THE SAME

BACKGROUND

1. Technical Field

The present invention relates to a storage media conversion device and, in particular, to a storage media conversion device compatible with 3.5-inch and 2.5-inch hard disks, and a server using the same.

2. Related Art

A variety of storage media devices (e.g. a hard disk, a CD-ROM, a CD burner) are utilized in a computer system such as a server cabinet. In general, the sizes of the storage media devices are 3.5-inch, 2.5-inch, and 1.8-ch. The 3.5-inch hard disk is for use with a desktop computer, a server, a server cabinet, a telecom cabinet, or etc. The 2.5-inch hard disk is usually for use with a notebook computer. The 1.8-inch hard disks are for use with a small number of notebook computers. The 2.5-inch hard disk is categorized into a magnetic recording type hard disk drive (HDD), a solid state disk (SSD), and a hybrid drive combining the HDD and the SSD. The SSD is constituted by a flash memory, a storage control chip and a circuit board. Since the SSD have no mechanical components of the magnetic recording type HDD, it is not easy to be damaged by collisions or shaking. Therefore, compared to the traditional 3.5-inch hard disk, the 2.5-inch hard disk is used extensively in high performance servers and storage arrays.

In taking into account the cost and performance, based on actual demands, any different size of the data storage device can be selected for use with optimal effect. For a user already having server racks, it is a waste in the material and cost to replace the existing loading plate structure of the server cabinet to fit with the 2.5-inch hard disk. Next, when replacing or maintaining each storage media device, since the storage media device is mostly fixed by screws, it takes long time to align screws with screw holes and to screw the screws one by one. As a result, a server shutdown time for maintenance increases, and manpower and material resources are also wasted.

Since the storage cabinet or the telecom cabinet needs to be used in a long period of time, it is necessary to facilitate compatibility, repair, and replacement in the whole system, and to make repair and maintenance done quickly, simply and conveniently, thereby reducing the server shutdown time and other losses in manpower and etc.

In view of the foregoing, the inventor made various studies to improve the above-mentioned problems to realize the improvements, on the basis of which the present invention is accomplished.

BRIEF SUMMARY

It is an object of the present invention to provide a storage media conversion device and a server using the same, wherein the storage media conversion device allows quick replacement of different sizes of hard disks without any tool.

Accordingly, the present invention provides a storage media conversion device which comprises a mounting bracket and a holder. The mounting bracket includes a first baseplate and two corresponding side plates disposed perpendicularly on the first baseplate. The first baseplate and the two side plates enclose a first loading space. Any of the side plates includes a first resilient positioning portion for positioning a first size hard disk. The holder includes a pivot shaft pivotally connected to one side of the first baseplate, a handle rotatable with respect to the pivot shaft, and a contact portion disposed close to the pivot shaft, wherein the length from the handle to the pivot shaft is greater than the length from the contact portion to the pivot shaft.

The present invention also provides a server in another broad embodiment, which includes a plurality of storage media conversion devices and a loading plate. The loading plate is disposed with a plurality of pairs of side plates. A third loading space and a plurality of engaged portions are disposed between each pair of the side plates. Each of the third loading spaces is provided for positioning each of the mounting brackets. Each of the engaged portion is provided for disposing the contact portion of the holder, so that the holder is movable with respect to the loading plate.

The present invention also has the following effects. The present invention can position the hard disk with ease, no matter whether it is the first size hard disk or the second size hard disk, by using the mounting bracket or together with the conversion bracket. In addition, the present invention has the effects of quick assembly and effective positioning. When installing the second size hard disk as required, the second size hard disk can fit in the original equipment (i.e. the first size hard disk) by simply using the conversion bracket. Different sizes of hard disks can be applied as required without a need of changing the original equipment, so the present invention can augment equipment and save cost. Furthermore, the holder is combined onto the first baseplate of the mounting bracket. The contact portion is disposed corresponding to the engaged portion of the loading plate. When removing the first size hard disk or the second size hard disk for replacement or maintenance, the holder rotates around the pivot shaft to make the contact portion push against the engaged portion, thereby disconnecting the first size hard disk or the second size hard disk from a corresponding electrical connector, so as to facilitate replacement or maintenance.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 5 is assembled on the loading plate.

DETAILED DESCRIPTION

The present invention provides a storage media conversion device, compatible with 3.5-inch hard disk and 2.5-inch hard disk, and a server using the storage media conversion device. Preferably, the first size hard disk herein is a 3.5-inch hard disk (HDD), and the second size hard disk herein is a smaller size 2.5-inch hard disk. However, in a different embodiment, the second size hard disk can be a 1.8-inch hard disk. In addition to the server, the storage media conversion device of the present invention can be applied to a commonly used computer system or any equipment in need of changing to a small size hard disk. The hard disk mentioned herein includes but is not limited to any hot-plugging type storage device. In the following, detailed descriptions along with accompanied drawings are given to better explain the features and technical contents of the present invention. However, the following descriptions and the accompanied drawings are for reference and illustration only, and are not intended to limit the scope of the present invention.

Figure 1:
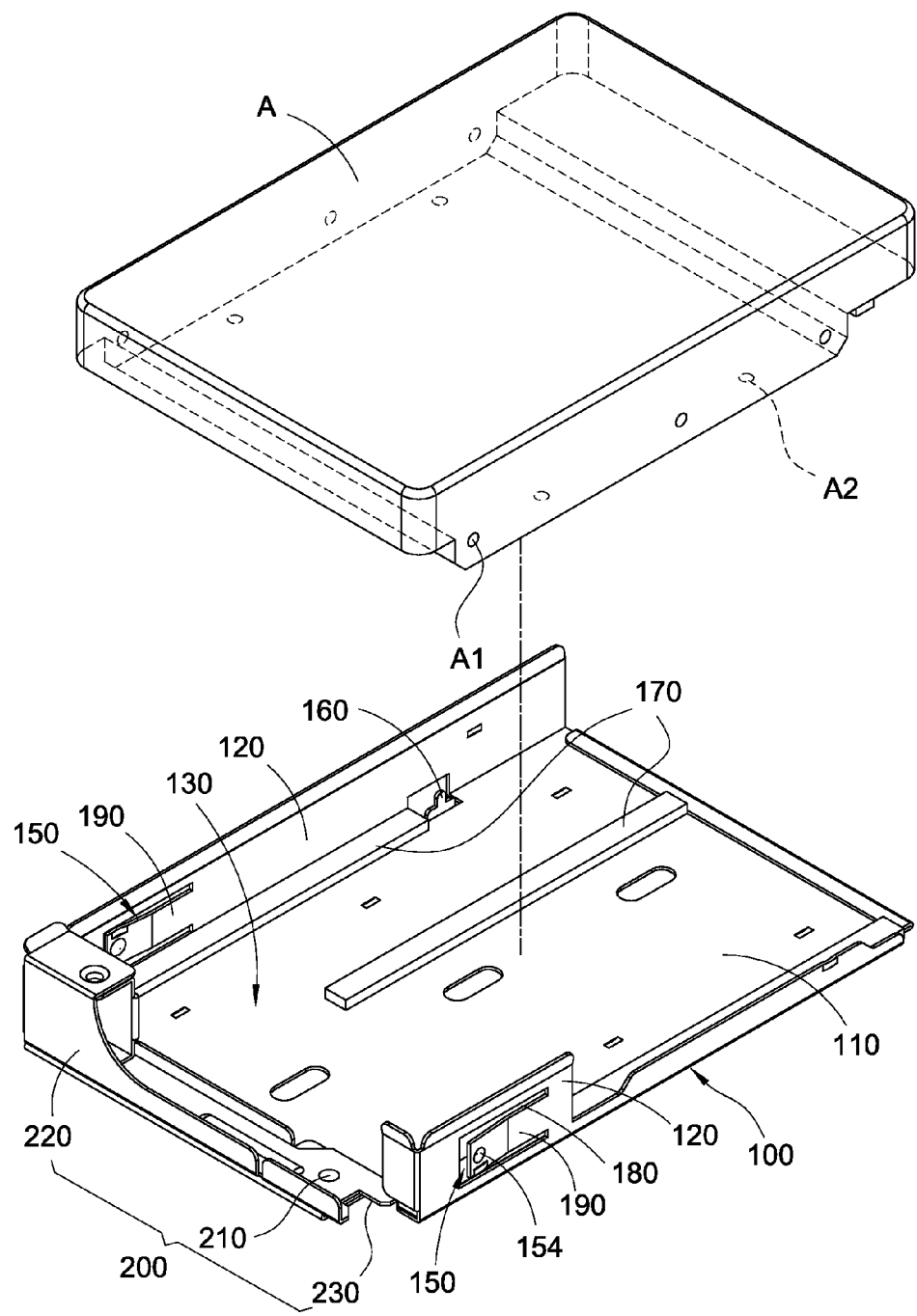
FIG. 1 is an exploded view illustrating how a mounting bracket and a first size hard disk are used together according to the present invention.
Figure 2:
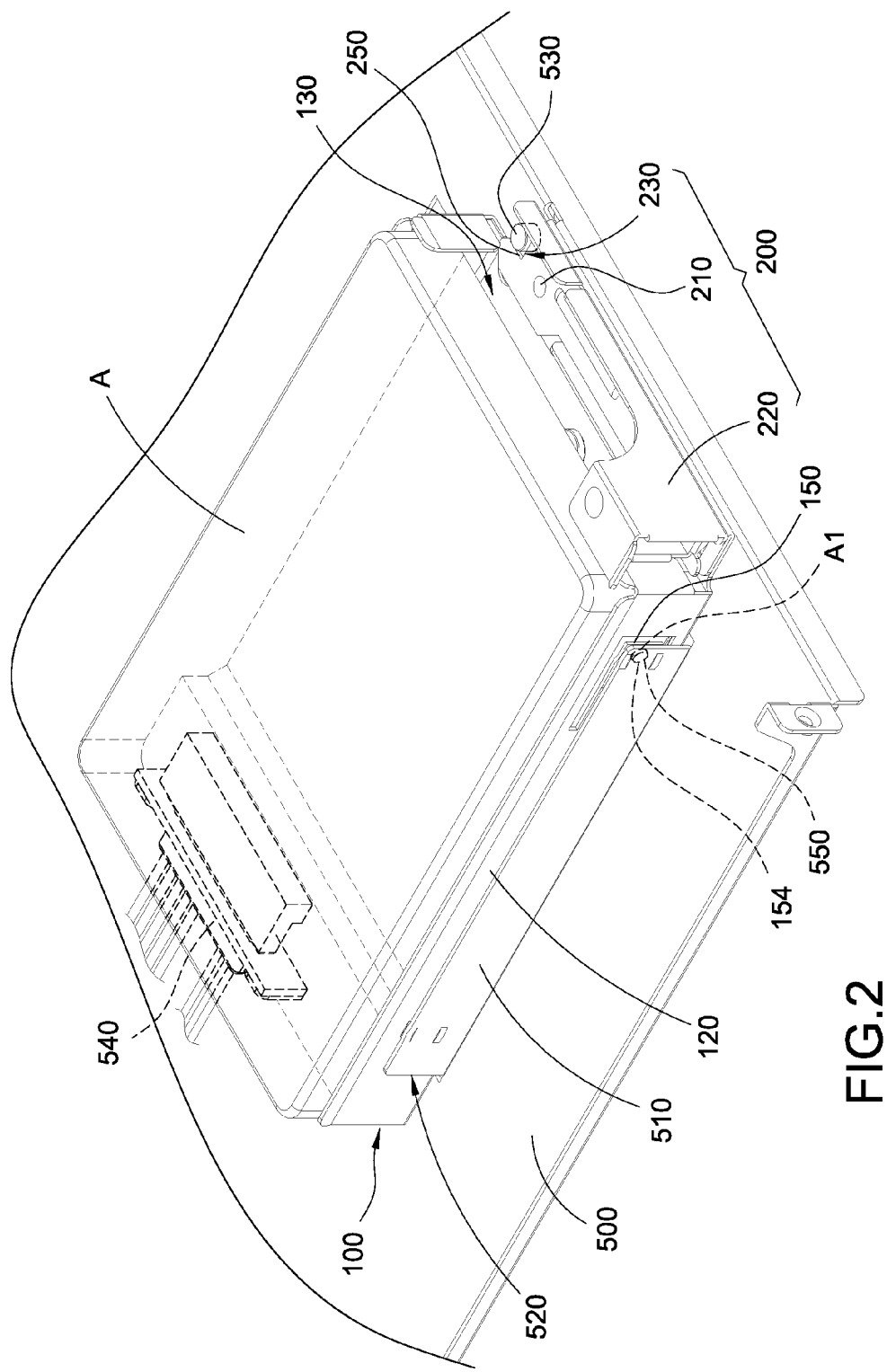
FIG. 2 is a perspective view illustrating that FIG. 1 is assembled on a loading plate.
Figure 3:
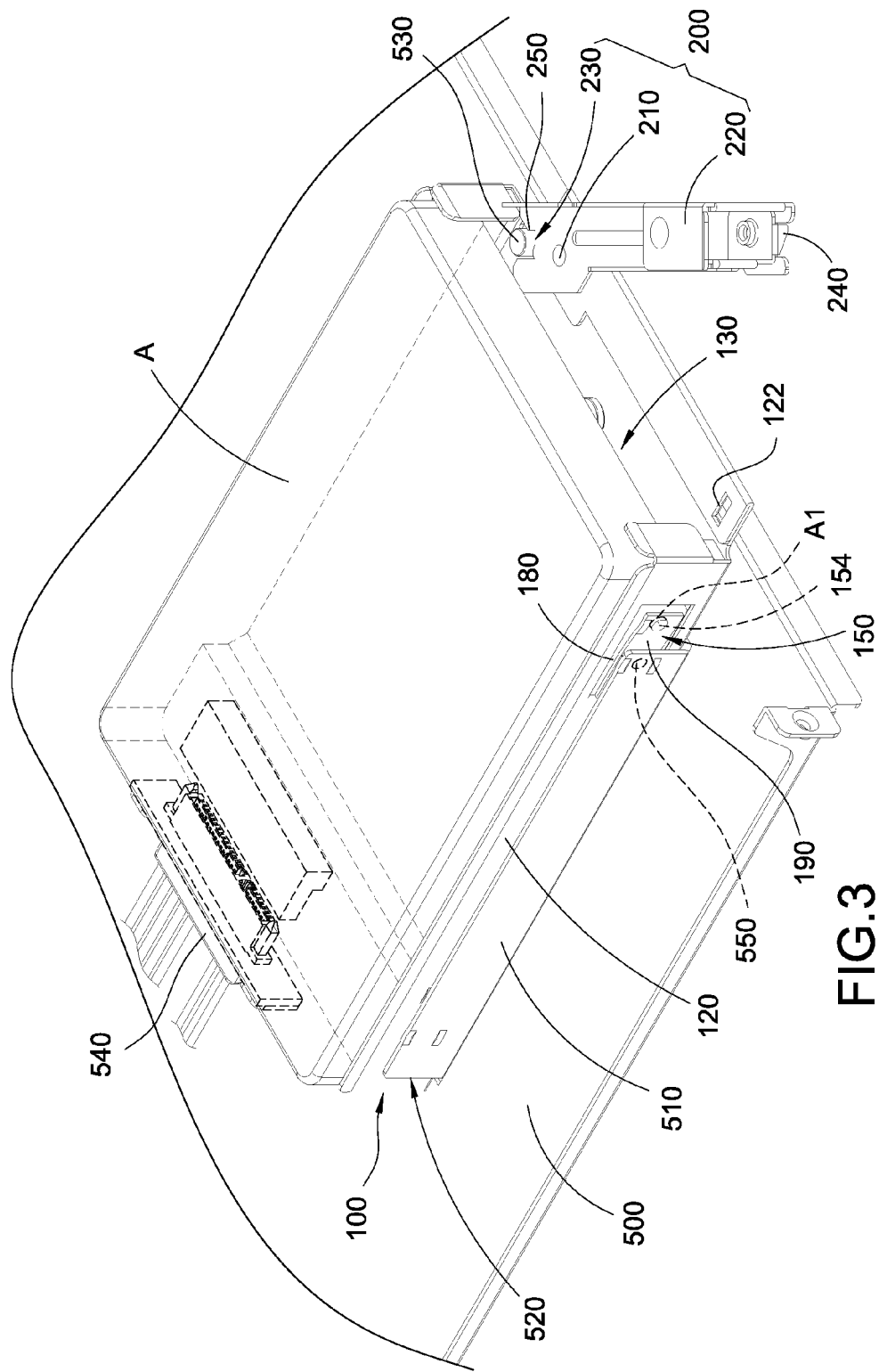
FIG. 3 is an embodiment view illustrating rotating a holder of FIG. 2.

Referring to FIGS. 1 to 3, the present invention provides a storage media conversion device which comprises a mounting bracket 100 and a holder 200. As shown in FIG. 1, the mounting bracket 100 includes a first baseplate 100 and two corresponding side plates 120 extending perpendicularly from the first baseplate 110. The first baseplate 110 and the two side plates enclose a first loading space 130, wherein any of the side plates 120 includes a first resilient positioning portion 150 for engagement with a screw hole A1 of a first size hard disk A. In the embodiment shown in FIG. 1, it is preferable that two corresponding side plates 120 both have the first resilient positioning portion 150. Furthermore, the first resilient positioning portion 150 further includes a slot 180 and a first extending arm 190. One end of the first extending arm 190 is connected to the side plate 120, and the other end includes a protrusion point 154 resiliently movable in the slot 180. The protrusion point 154 protrudes toward the first loading space 130, so as to be engaged with the screw hole A1 of the first size hard disk A. Moreover, the first extending arm 190 having the protrusion point 154 is inclined outwardly from the side plate 120, so as to be engaged with a third resilient positioning portion 550 of a loading plate 500, as shown in FIG. 2 and FIG. 3. Therefore, the protrusion point 154 of the first extending arm 190 can be engaged with the screw hole A1 and the third resilient portion 550.

The mounting bracket 100 further includes a fixed pillar 160 and at least one buffer 170. The fixed pillar 160 protrudes perpendicularly from the first baseplate 110 for engagement with a screw hole A2 of the first size hard disk A. The buffer 170 is disposed on an inner surface of the first baseplate 110 to contact the first size hard disk for avoiding damage by collision. The number and material of the buffer 170 are not limited herein. The holder 200 includes a pivot shaft 210 pivotally connected to one side of the first baseplate 110, a handle 220 rotatable with respect to the pivot shaft 210, and a contact portion 230 disposed close to the pivot shaft 210, wherein the length from the handle 220 to the pivot shaft 210 is greater than the length from the contact portion 230 to the pivot shaft 210. Referring to FIG. 3, the contact portion 230 further includes a plurality of edges 250, and the plurality of edges 250 together form a recess for pushing against the engaged portion 530. The mounting bracket 100 further includes a groove 122 formed on the first baseplate 110, and the handle 220 includes a hook 240 which is disposed corresponding to the groove 122 and is positioned therein.

Referring to FIG. 2 and FIG. 3, the present invention further provides a server in another broad embodiment. The server includes a plurality of the aforesaid storage media conversion devices and a loading plate 500. The loading plate 500 is disposed with a plurality of pairs of side plates 510. A third loading space 520 and a plurality of engaged portions 530 are disposed between each pair of the side plates 510. Each of the third loading spaces 520 is provided for positioning each of the mounting brackets 100. In the present embodiment, only one mounting bracket 100, carrying the first size hard disk A, is exemplified. As shown in the figures, the engaged portion 530 is disposed corresponding to the contact portion 230 of the mounting bracket 100. When the handle 220 rotates with respect to the pivot shaft 210, the mounting bracket 100 and the first size hard disk A move with respect to the loading plate 500. In the embodiment shown in FIG. 3, the engaged portion 530 is preferably a protruding pillar protruding from a surface of the loading plate 500.

As shown in FIG. 2, when the mounting bracket 100 installed with the first size hard disk A is assembled in the third loading space 520 of the loading plate 500, the first size hard disk A is electrically connected to one side of the loading plate 500 upon exertion of force by the user. At this point, the two first resilient positioning portions 150 at two sides of the mounting bracket 100 are engaged with the two third resilient positioning portions 550 at the pair of side plates 510, and assembly of the first size hard disk A is accomplished. Referring to FIG. 3, when the handle 220 of the holder 200 rotates around the pivot shaft 210 as an axis, the edge 250 of the contact portion 230 pushes against the engaged portion 530, so as to disconnect the first size hard disk A from the electrical connector 540. At this point, the first resilient positioning portions 150 of the mounting bracket 100 are disengaged from the third resilient positioning portions 550 of the pair of side plates 510, and disassembly of the first size hard disk A is accomplished.

Figure 4:
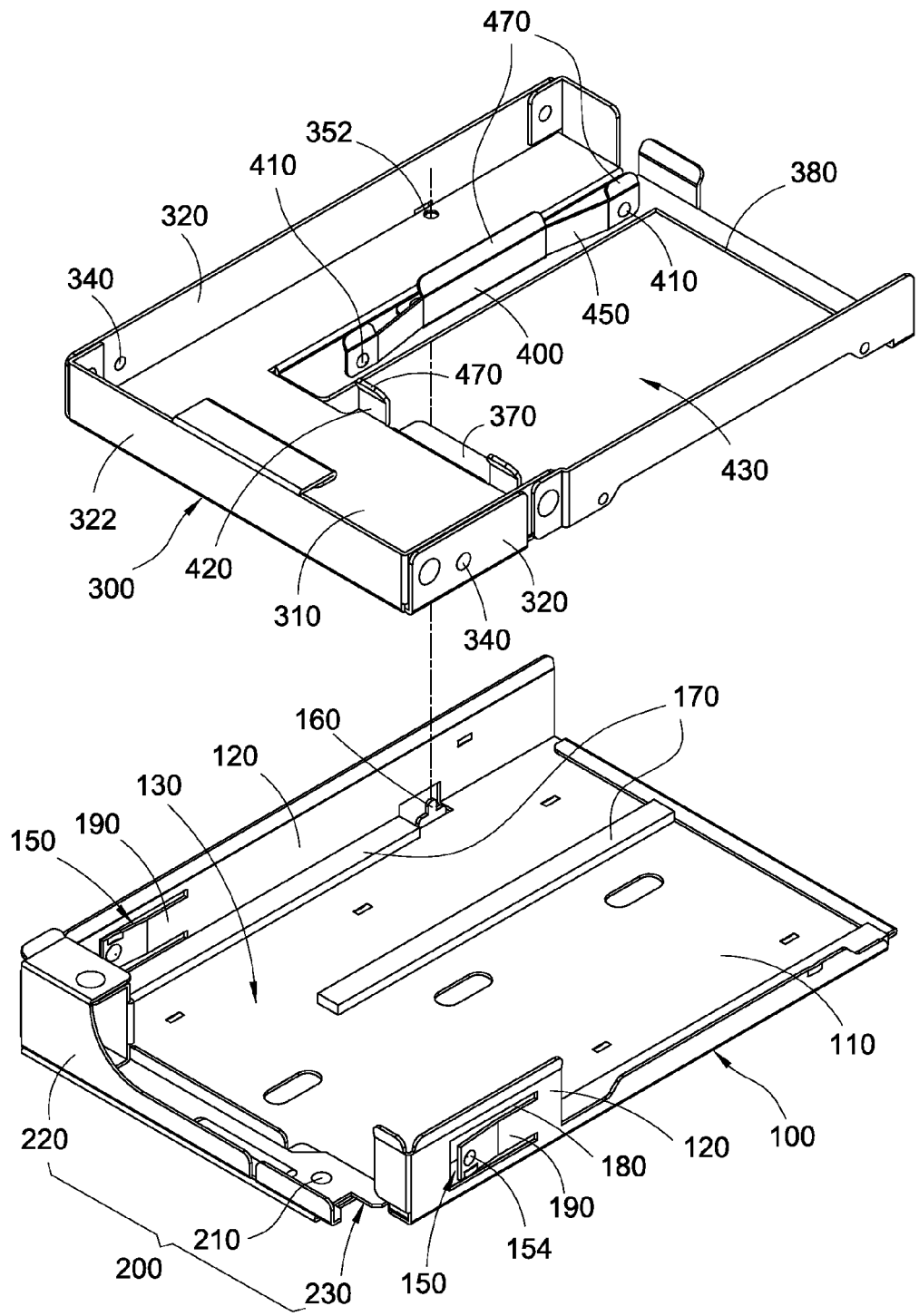
FIG. 4 is an exploded view illustrating how the mounting bracket and a conversion bracket are used together according to the present invention.
Figure 5:
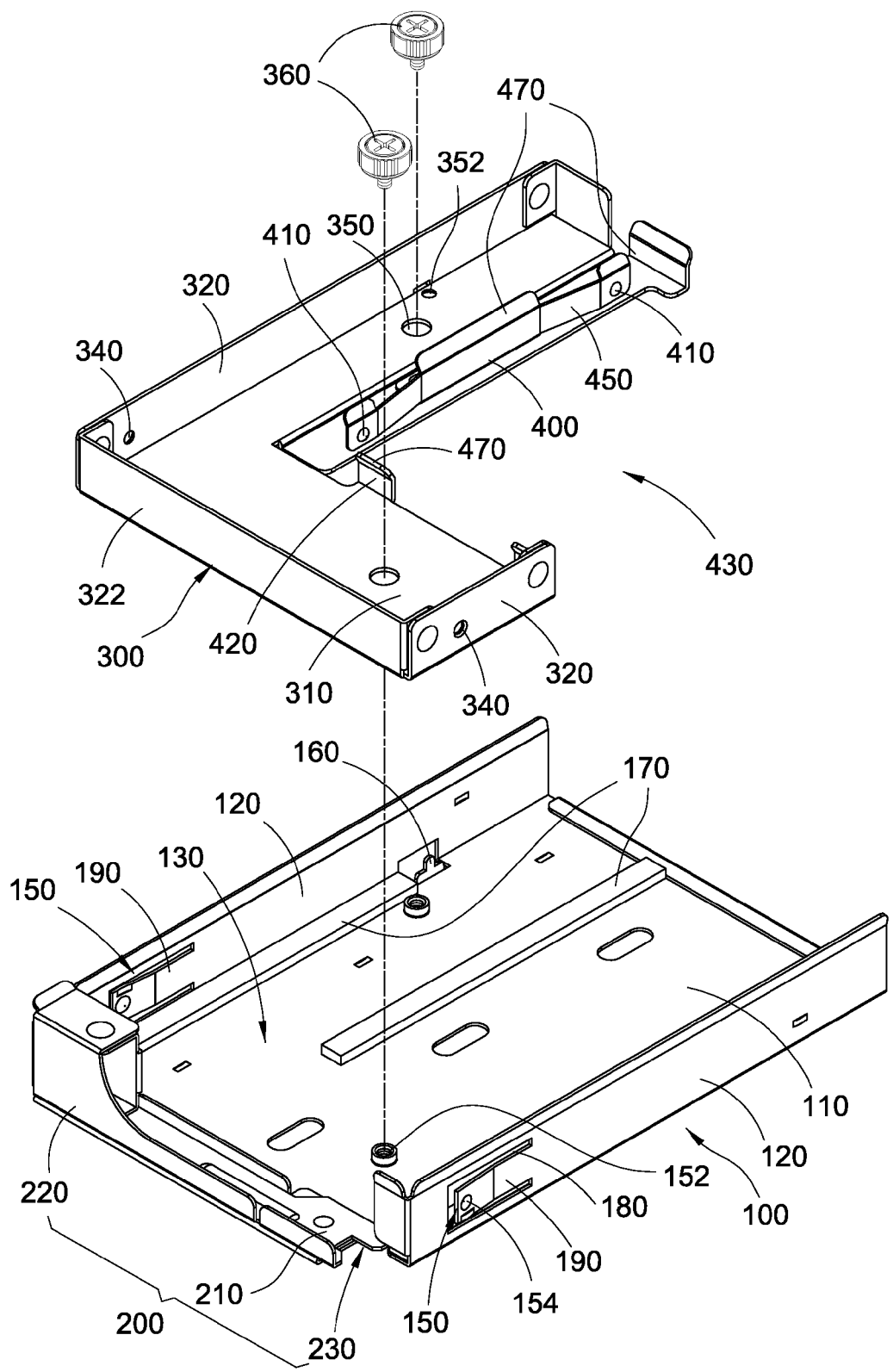
FIG. 5 is an exploded view illustrating how another mounting bracket and the conversion bracket are used together according to the present invention.

When to install the second size hard disk B as required, the user only needs to use the conversion bracket together, and then the second size hard disk B can fit with the original equipment. Referring to FIG. 4 and FIG. 5, in the present embodiment, the conversion bracket 300 is positioned in the first loading space 130 of the mounting bracket 100. The conversion bracket 300 includes a second baseplate 310, two long side plates 320 extending perpendicularly from the second baseplate 310, and at least one short side plate 322, a support stand 400, and at least one positioning element 420. A fastening portion 340 is disposed on any of the corresponding long side plates 320 for positioning the first resilient positioning portion 150 on the mounting bracket 100. The support stand 400 is disposed perpendicularly on the second baseplate 310 and parallel to one of the long side plates 320. The support stand 400 includes at least one second resilient positioning portion 410. In the present embodiment, the support stand 400 further includes two second extending arms 450. Each of the second extending arms 450 extends toward two sides of the support stand 400, and the second resilient positioning portion 410 is disposed on one end of the second extending arm 450 for engagement with a screw hole B1 of the second size hard disk B.

The plate-form positioning element 420 is disposed perpendicular on the second baseplate 310 and parallel to at least one of the short side plates 322. The positioning element 420, the support stand 400, and one of the side plates 120 together enclose a second loading space 430 for positioning the second size hard disk B. Each of the second extending arms 450 allows resilient movement of the second resilient positioning portion 410, and is more inclined toward the second loading space 430 than the support stand 400, so that the second size hard disk B is well positioned. Furthermore, the fastening portion 340 on the long side plate 320 is preferably a round hole for engagement with the first resilient positioning portion 150. The first/second resilient positioning portion 150 or 410 is preferably a protruding point.

As shown in FIG. 4, the second baseplate 310 further includes a positioning hole 352, a baffle plate 370, and an opening 380. The positioning hole 352 is engaged with the fixed pillar 160, which means that the fixed pillar 160 is inserted through the positioning hole 352 for engagement with the conversion bracket 300. The opening 380 is formed on the second baseplate 310 and is disposed corresponding to the second loading space 430. The second size hard disk B is entirely or partially in contact with the first baseplate 110 of the mounting bracket 100. As shown in FIG. 4, it is preferable that the second size hard disk B is directly positioned on the conversion bracket 300, and then assembled on the mounting bracket 100, wherein the baffle plate 370 protrudes toward the opening 380 to support the second size hard disk B. However, as shown in FIG. 5, the conversion bracket 300 can position one side of the second size hard disk B by using the support stand 400, and then by using the other side plate 120 together, the second size hard disk B is positioned. The present invention does not limit the method for positioning the second size hard disk B, and the design between the mounting bracket 100 and the conversion bracket 300 can change as required.

In order to enhance the engagement effect between the conversion bracket 300 and the mounting bracket 100, the embodiment shown in FIG. 5 further includes an assembly element 360. The mounting bracket 100 includes an assembly hole 152. The conversion bracket 300 includes an opening 350 disposed corresponding to the assembly hole 152. The assembly element 360 is inserted through the opening 350 to be fixed in the assembly hole 152. The assembly element 360 is preferably a screw or the like. Furthermore, in order to install the second size hard disk B with ease, one end of the support stand 400, one end of the positioning element 420, and an upper edge of each of the second extending arms 450 respectively include a guiding portion 470 for guiding the second size hard disk B to be installed in the second loading space 430. Therefore, according to the present embodiment, by using the mounting bracket 100 or together with the conversion bracket 300, the hard disk can be positioned with ease, no matter whether it is the first size hard disk A or the second size hard disk B. Therefore, the present invention has the effects of quick assembly and effective positioning.

Figure 6:
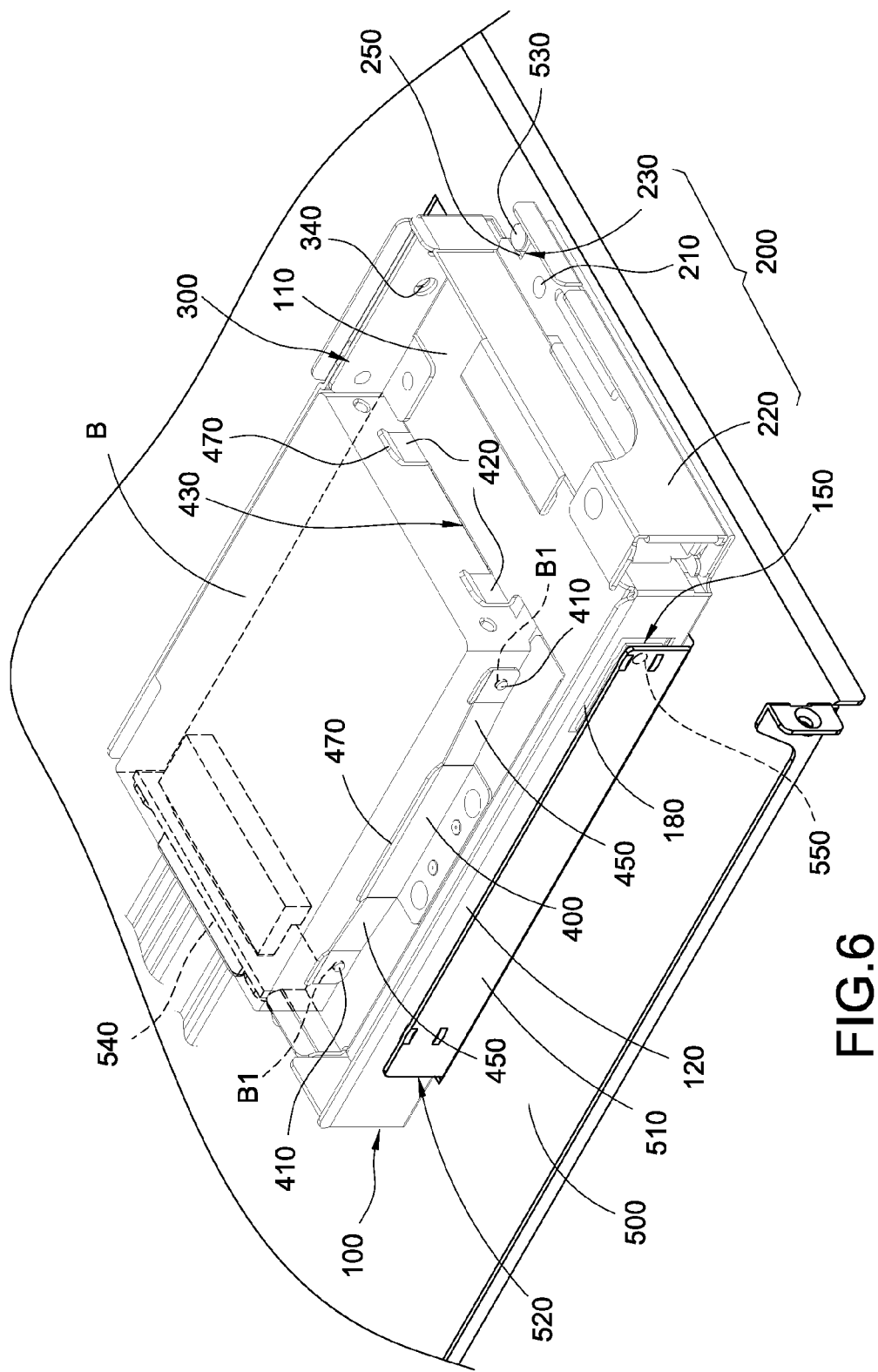
FIG. 6 is a perspective view illustrating that FIG. 4
Figure 7:
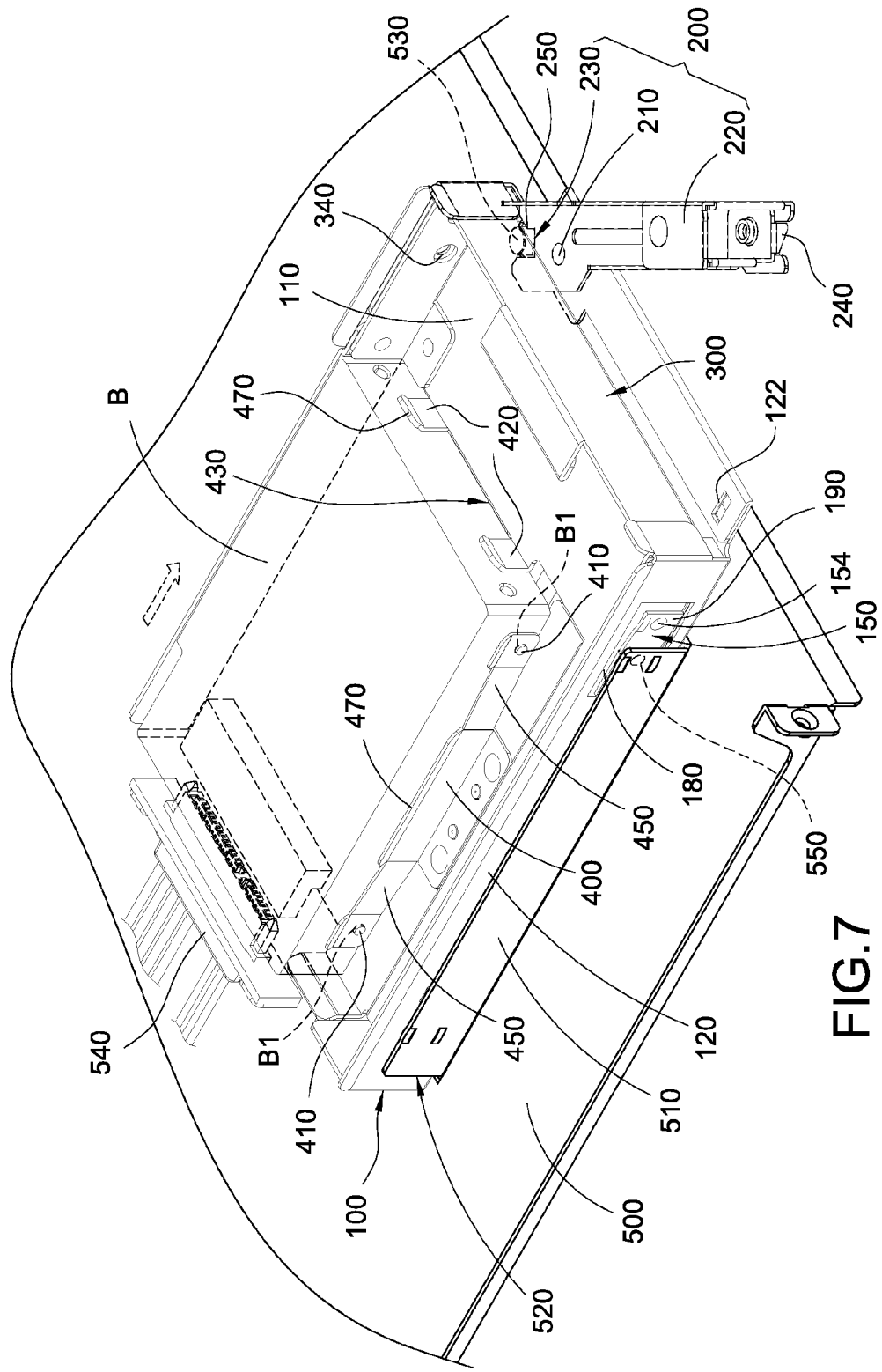
FIG. 7 is an embodiment view illustrating rotating the holder of FIG. 6.

As shown in FIG. 6, when the mounting bracket 100 installed with the first size hard disk B and the conversion bracket 300 is assembled in the third loading space 520 of the loading plate 500, the second size hard disk B is electrically connected to electrical connector 540 at one side of the loading plate 500 upon exertion of force by the user. At this point, the first resilient positioning portions 150 at two sides of the mounting bracket 100 are engaged with the two third resilient portions 550 at the pair of the side plates 510, and thereby assembly of the second size hard disk B is accomplished. Referring to FIG. 7, when the handle 220 of the holder 200 rotates around the pivot shaft 210, the edge of the contact portion 230 pushes against the engaged portion 530 to disconnect the first size hard disk A or the second size hard disk B from the corresponding electrical connector 540, thereby facilitate replacement or maintenance.

The third resilient positioning portion 550 is also a protruding point protruding toward the third loading space 520 for engagement with the first resilient positioning portion 150.

It is to be understood that the above descriptions are merely preferable embodiment of the present invention and not intended to limit the scope of the present invention. Equivalent changes and modifications made in the spirit of the present invention are regarded as falling within the scope of the present invention, and the scope of the present invention is defined by the appended claims.

What is claimed is:

1. A storage media conversion device, for using with a plurality of first size hard disks (A) or a plurality of second size hard disks (B), the first size hard disk (A) being larger in size than the second size hard disk (B), the storage media conversion device comprising: a mounting bracket (100) including a first baseplate (110) and two corresponding side plates (120) disposed perpendicularly on the first baseplate (110), the first baseplate (110) and the side plates (120) enclosing a first loading space (130), wherein any of the side plates (120) includes a first resilient positioning portion (150), and the first resilient positioning portion (150) is provided for positioning the first size hard disk (A); and a holder (200) including a pivot shaft (210) pivotally connected to one side of the first baseplate (110), a handle (220) rotatable with respect to the pivot shaft (210), and a contact portion (230) disposed close to the pivot shaft (210), wherein the length from the handle (220) to the pivot shaft (210) is greater than the length from the contact portion (230) to the pivot shaft (210); and a conversion bracket (300) disposed in the first loading space (130) of the mounting bracket (100), the conversion bracket (300) comprising: a second baseplate (310), two long side plates (320) extending perpendicularly from the second baseplate (310) a support stand (400) disposed perpendicularly on the second baseplate (310) at least one positioning element (420) perpendicularly disposed on the second baseplate (310) and parallel to at least one short side plate (322), wherein the positioning element (420), the support stand (400), and one of the side plates (120) enclose a second loading space (430) for positioning the second size hard disk (B).

2. The storage media conversion device of claim 1, wherein the first resilient positioning portion (150) further comprises a slot (180) and a first extending arm (190), one end of the first extending arm (190) is connected to the side plate (120), the other end includes a protrusion point (154) resiliently movable in the slot (180), the protrusion point (154) protrudes toward the first loading space (130), and the first extending arm (190) including the protrusion point (154) is inclined outwardly from the side plate (120).

3. The storage media conversion device of claim 1, further including a fastening portion (340) is disposed on any of the corresponding long side plates (320) for positioning the first resilient positioning portion (150); a support stand (400) disposed parallel to one of the long side plates (320), the support stand (400) includes at least one second resilient positioning portion (410).

4. The storage media conversion device of claim 3, wherein the support stand (400) further includes two second extending arms (450), each of the second extending arms (450) extends toward two sides of the support stand (400), and the second resilient positioning portion (410) is disposed on one end of the second extending arm (450) for positioning the second size hard disk (B).

5. The storage media conversion device of claim 3, wherein the mounting bracket (100) further includes a fixed pillar (160) and at least one buffer (170), the buffer (170) is disposed on the first baseplate (110), the conversion bracket (300) includes a positioning hole (352) for positioning the fixed pillar (160).

6. The storage media conversion device of claim 3, wherein the fastening portion (340) is a round hole, the second baseplate (310) further includes a baffle plate (370) and an opening (380), the opening (380) is formed on the second baseplate (310) and disposed corresponding to the second loading space (430), the baffle plate (370) protrudes toward the opening (380) to carry the second size hard disk (B).

7. The storage media conversion device of claim 3, further comprising an assembly element (360), the mounting bracket (100) including an assembly hole (152), the conversion bracket (300) including an opening (350) corresponding to the assembly hole (152), the assembly element (360) being inserted through the opening (350) to be positioned in the assembly hole (152).

8. The storage media conversion device of claim 5, wherein one end of the support stand (400), one end of the positioning element (420), and an upper edge of the second extending arm (450) respectively include a guiding portion (470) for guiding the second size hard disk (B) to be assembled in the second loading space (430), and the second resilient positioning portion (410) is a protruding point protruding toward the second loading space (430).

9. The storage media conversion device of claim 1, wherein the mounting bracket (100) further comprises a groove (122) formed on the first baseplate (110), the handle (220) includes a hook (240) which is disposed corresponding to the groove (122) and is positioned therein.

10. The storage media conversion device of claim 1, wherein the contact portion (230) has a plurality of edges (250) to form a recess.

11. A server for using with a plurality of first size hard disks (A) or a plurality of second size hard disks (B), the first size hard disk (A) being greater in size than the second size hard disk (B), the server comprising: a plurality of mounting brackets (100), each of the mounting brackets (100) including a first baseplate (110) and two corresponding side plates (120) disposed perpendicularly on the first baseplate (110), the first baseplate (110) and the side plates (120) enclosing a first loading space (130), wherein any of the side plates (120) includes a first resilient positioning portion (150); a plurality of holders (200), each of the holders (200) including a pivot shaft (210), a handle (220), and a contact portion (230), the pivot shaft (210) being pivotally connected to the first baseplate (110), the handle (220) being rotatable with respect to the pivot shaft (210), and the contact portion (230) being disposed close to the pivot shaft (210), wherein the length from the handle (220) to the pivot shaft (210) is greater than the length from the contact portion (230) to the pivot shaft (210); and a loading plate (500) disposed with a plurality of pairs of side plates (510), a third loading space (520) and a plurality of engaged portions (530) being disposed between each pair of the side plates (510), each of the third loading spaces (520) being provided for positioning each of the mounting brackets (100), the engaged portion (530) being disposed corresponding to the contact portion (230) of the holder (200), wherein the handle (220) is rotatable with respect to the pivot shaft (210), the mounting bracket (100) is movable with respect to the loading plate (500); and each pair of the side plates (510) further includes a third resilient positioning portion (550) engages to the first resilient positioning portion (150) for positioning the first resilient positioning portion (150), the third resilient positioning portion (550) is a protruding point protruding toward the third loading space (520), the engaged portion (530) is a protruding pillar.

12. The server of claim 11, wherein the loading plate (500) further comprising a plurality of electrical connectors (540), each of the electrical connectors (540) being disposed corresponding to each of the third loading spaces (520) for electrically connected to the first size hard disks (A) or the second size hard disks (B).

13. The server of claim 11, wherein the first resilient positioning portion (150) further comprises a slot (180) and a first extending arm (190), one end of the first extending arm (190) is connected to the side plate (120), the other end includes a protrusion point (154) resiliently movable in the slot (180), the protrusion point (154) protrudes toward the first loading space (130), and the first extending arm (190) including the protrusion point (154) is inclined outwardly from the side plate (120).

14. The server of claim 11, further including a plurality of conversion brackets (300) disposed in the first loading space (130) of the mounting bracket (100), each of the conversion brackets (300) comprising:
a second baseplate (310), two long side plates (320) extending perpendicularly from the second baseplate (310), and at least one short side plate (322), a fastening portion (340) being disposed on any of the corresponding long side plates (320) for positioning the first resilient positioning portion (150);
a support stand (400) disposed perpendicularly on the second baseplate (310) and parallel to one of the long side plates (320), the support stand (400) including at least one second resilient positioning portion (410); and
at least one positioning element (420) perpendicularly disposed on the second baseplate (310) and parallel to the at least one short side plate (322), wherein the positioning element (420), the support stand (400), and one of the side plates (120) enclose a second loading space (430).

15. The server of claim 14, wherein the support stand (400) further includes two second extending arms (450), each of the second extending arms (450) extends toward two sides of the support stand (400), and the second resilient positioning portion (410) is disposed on one end of the second extending arm (450).

16. The server of claim 14, wherein the mounting bracket (100) further includes a fixed pillar (160) and at least one buffer (170), the buffer (170) is disposed on the first baseplate (110), the conversion bracket (300) includes a positioning hole (352) for positioning the fixed pillar (160).

17. The server of claim 14, further comprising a plurality of assembly elements (360), each of the mounting brackets (100) including an assembly hole (152), each of the conversion brackets (300) including an opening (350) corresponding to the assembly hole (152), each of the assembly elements (360) being inserted through the opening (350) to be positioned in the assembly hole (152).

18. The server of claim 14, wherein one end of the support stand (400), one end of the positioning element (420), and an upper edge of the second extending arm (450) respectively include a guiding portion (470), the second resilient positioning portion (410) is a protruding point protruding toward the second loading space (430), the contact portion (230) has a plurality of edges (250) to form a recess.

19. The server of claim 16, wherein each of the conversion brackets (300) includes a positioning hole (352) for positioning the fixed pillar (160), and the fastening portion (340) is a round hole.

* * * * *